United States Patent [19]

Wang et al.

[11] Patent Number: 5,869,985
[45] Date of Patent: Feb. 9, 1999

[54] LOW VOLTAGE INPUT BUFFER

[75] Inventors: Nanlei Larry Wang, Palo Alto; Ronald Patrick Green, Santa Clara, both of Calif.

[73] Assignee: EIC Enterprises Corporation, Tortola, Virgin Islands (Br.)

[21] Appl. No.: 797,495

[22] Filed: Feb. 7, 1997

[51] Int. Cl.$^6$ .............................................. H03K 19/0944
[52] U.S. Cl. ........................... 326/109; 326/115; 326/126
[58] Field of Search .................................... 326/115, 126, 326/109, 110, 82, 83, 89; 327/65, 563

[56] References Cited

U.S. PATENT DOCUMENTS

| 5,083,046 | 1/1992 | Nagasawa | 326/115 |
| 5,177,378 | 1/1993 | Nagasawa | 326/83 |
| 5,227,734 | 7/1993 | Schindler et al. | 330/54 |
| 5,614,860 | 3/1997 | Osaki et al. | 327/552 |

*Primary Examiner*—Michael Tokar
*Assistant Examiner*—Qui Van Duong
*Attorney, Agent, or Firm*—Townsend and Townsend and Crew LLP; Henry K. Woodward

[57] ABSTRACT

A differential input buffer operable at power supply voltages below 3.0 V comprises first and second field effect transistors connected between a power supply and a current source as a differential pair in receiving input and input bar signals. Using enhancement mode field effect transistors and heterojunction bipolar transistors for a current source, a power supply voltage Vcc as low as 2 V is possible for circuit operation.

5 Claims, 1 Drawing Sheet

LOW VOLTAGE INPUT BUFFER

BACKGROUND OF THE INVENTION

This invention relates generally to buffer circuitry for high frequency applications, and more particularly the invention relates to a high frequency input buffer operable with low power voltages.

In modulator circuitry for cellular phone applications, in phase (I, $\bar{\text{I}}$) and quadrature phase (Q, $\bar{\text{Q}}$) inputs are received by respective differential buffers. FIG. 1 is a schematic of a conventional buffer for the baseband I, $\bar{\text{I}}$ inputs using a Vcc power source of 5 V, for example. The bipolar transistors Q1, Q2 form a differential pair which respectively receive the I and $\bar{\text{I}}$ inputs through resistors R1, R3. Resistor R2 connected between the transistor base regions forms a voltage divider with R1 and R2. Vcc is connected through resistors R7, R8 to the collectors of Q1, Q2 with the buffer outputs taken at the collectors. Transistors Q3, Q4 form a current source for the differential pair with diode connected transistor Q4 connected through resistor R6 to a regulated voltage (Vreg) and to circuit ground with the base of Q4 providing base current to Q3. Transistor Q3 is connected to circuit ground and through resistors R4, R5 to the emitters of Q1, Q2.

Since Vce of Q3 has a minimum voltage of 0.6 V for gallium arsenide heterojunction bipolar transistor (GaAs HBT) technology, and 0.8 to 1.0 V for silicon bipolar technology, the bases of Q1 and Q2 must be at 2 V or above. Therefore, Vcc must be greater than 4 V if the I and Q ports are at Vcc/2. If Vcc is less than 4 V, then the current source cannot be implemented and a common resistor to ground must be used. Further, a power down function cannot be implemented. If Vcc is further reduced to 3 V and less, Vcc/2 becomes less than Vbe of the heterojunction bipolar transistor and the circuit cannot be implemented at all with HBT technology.

SUMMARY OF THE INVENTION

In accordance with the invention, field effect transistors are employed as a differential transistor pair in a differential input buffer which is operable at a power supply voltage below 3.0 V. The field effect transistors are connected through resistive means to a current source which preferably comprises heterojunction bipolar transistors. The drain regions of the field effect transistors can be connected to the base terminals of two bipolar transistors which comprise a second differential transistor pair. The field effect transistor differential pair respond to the I and $\bar{\text{I}}$ inputs and drive the bipolar transistor differential pair for a high speed high frequency application.

In a preferred embodiment, the field effect transistors comprise N-channel enhancement mode devices in which Vgs is limited to between 0 V and 0.7 V (for Schottky gate turn on).

The invention and objects and features thereof will be more readily apparent from the following detailed description and appended claims when taken with the drawings.

DETAILED DESCRIPTION OF THE PREFERRED EMBODIMENT

Figure 1:
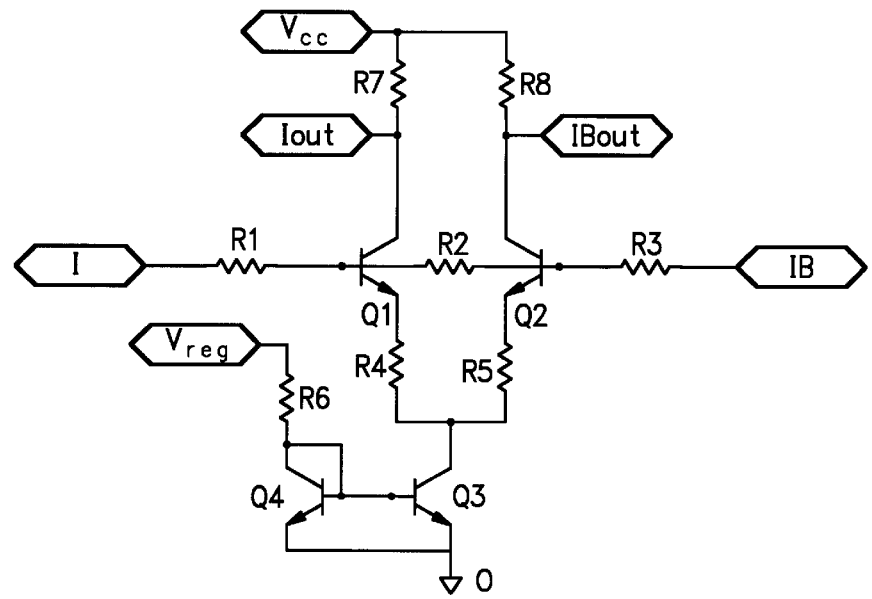
FIG. 1 is a schematic of a conventional differential input buffer employing bipolar transistors.
Figure 2:
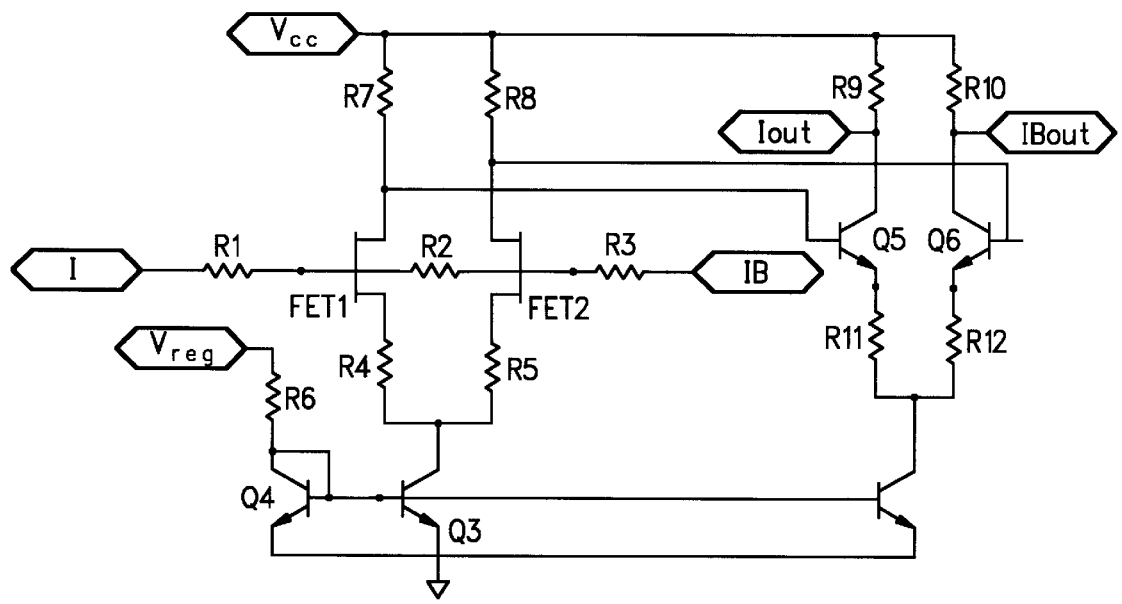
FIG. 2 is a schematic of a differential input buffer employing field effect transistors in accordance with a preferred embodiment of the invention.

FIG. 2 is a schematic of a differential input buffer employing field effect transistors in accordance with the present invention. The circuit is similar to the circuit of FIG. 1, and like elements have the same reference numbers. However, bipolar transistors Q1, Q2 of FIG. 1 are replaced by field effect transistors FET1, FET2 in FIG. 2. In addition, in this embodiment, a second differential transistor pair comprising bipolar transistors Q5, Q6 are provided in parallel with the field effect transistor pair and are driven by the field effect transistors. Transistors Q5, Q6 are connected respectively through resistors R9, R10 to Vcc and through resistors R11, R12 through a current source bipolar transistor Q7, which is also driven by current source transistor Q4.

For the enhancement mode FETs Vgs is limited to between 0 V and 0.7 V (Schottky gate turn on). A typical bias condition therefore is Vgs=0.4 V with an allowed amplitude of 0.3 V. This is 1 V less than the Vbe of a heterojunction bipolar transistor. Since I, $\bar{\text{I}}$, Q, $\bar{\text{Q}}$ lines handle signals typically at frequencies less than 100 MHZ, this part of the circuit is slow compared to the rest of the circuitry which may be operating above 800 MHZ.

With resistors R4, R5 as the source degenerate resistors and Vce of Q3>0.6 V, the gate voltage of FET1 and FET2 can swing over quite a range. Taking Vcc=2.7 V as an example, then I, $\bar{\text{I}}$, Q, $\bar{\text{Q}}$ are at 1.3 V. Resistors R4, R5 can support 0.35 V since Vgate−Vce(Q3)−Vgs=1.35−0.6−0.4= 0.35 V.

The output voltage of the differential FET stage can be much higher than Vcc/2, thus allowing the FET stage to feed into other heterojunction bipolar transistor circuitry such as the current source differential pair Q5, Q6.

Under this DC bias condition, the AC operation of the circuit can be analyzed as follows. With 0.3 V Vgs swing, Vgs the FETs can be turned fully off and on. Assuming FET1 has a −0.3 V Vgs swing with Vgs=0.4−0.3=0.1 V, then FET1 is not conducting current and the voltage across R4 is 0. Therefore, a total swing on the gate voltage of FET1 is 0.35 V+0.3 V=0.65 V downward. On the other side (FET2), Vgs=0.4 V+0.3 V=0.7 V and the FET will conduct all the current (twice the quiescent bias current). Resistor R5 will sustain twice the voltage, or 0.35*2=0.7 V. Therefore, the gate voltage upswing is 0.3+0.35=0.65 V. Thus, with a voltage Vcc=2.7 V, the voltages on the gates of the two FETs are 2.0 V and 0.7 V (conducting transistor and non-conducting transistor) with the source voltages of the FETs being 1.3 V and 0.6 V and the voltage Vce across transistor Q3 being 0.6 V. This represents the extreme case when FET1 is turned on and FET2 is turned off. The voltage swing is about 0.65 V, and the DC bias at I, $\bar{\text{I}}$, Q, $\bar{\text{Q}}$ lines is Vcc/2=1.35 V. For better linearity, the FETs are not turned completely on and off, and the overall voltage swing can be enhanced by the resistor voltage divider R1=R3 and R2.

Through use of FET transistors in the differential input buffer, the I, $\bar{\text{I}}$, Q, $\bar{\text{Q}}$ line voltage can be reduced to as low as 1.0 V allowing Vcc to reduce to 2 V for the input stage. This approach allows the input buffer to function easily down to Vcc=2.7 V while maintaining the current source/ power down feature.

While the invention has been described with reference to a specific embodiment, the description is illustrative of the invention is not to be construed as limiting the invention. Various modifications and applications may occur to those skilled in the art without departing from the true spirit and scope of the invention as defined by the appended claims.

What is claimed is:

1. A differential input buffer operable at power supply voltages below 3.0 V comprising:

(a) a power supply terminal for receiving a voltage which can be below 3.0 V;

(b) a circuit ground terminal;

(c) an input (I) terminal and an input bar ($\overline{I}$) terminal;

(d) first and second field effect transistors connected through first resistances to said power supply terminal and through second resistances and a first current source to said circuit ground terminal, each of said field effect transistors having source and drain regions and a channel region therebetween;

(e) third resistances connecting said input terminal to the gate of said first field effect transistor and said input bar terminal to the gate of said second field effect transistor, and (f) first and second bipolar transistors each having emitter, base, and collector regions, said first and second bipolar transistors connected as a differential transistor pair through fourth resistances to said power supply terminal and through fifth resistances and a second current source to said circuit ground terminal with the base regions coupled to the drain regions of the field effect transistors.

2. The differential input buffer as defined by claim 1, wherein said current source comprises a first bipolar transistor having a collector and an emitter serially connected between said second resistances and circuit ground, and bias means for providing a bias current to a base of said first bipolar transistor.

3. The differential input buffer as defined by claim 2, wherein said bias means of the current source comprises a diode connected second bipolar transistor connected through a fourth resistance to a regulated voltage terminal and to circuit ground, a base of said second bipolar transistor connected to the base of said first bipolar transistor.

4. The differential input buffer as defined by claim 1, wherein said first and second current sources each comprise first and second heterojunction bipolar transistors.

5. The differential input buffer as defined by claim 4, wherein said heterojunction bipolar transistors comprise III-V semiconductor material.

* * * * *